United States Patent
Matsumoto et al.

(10) Patent No.: US 9,807,873 B2
(45) Date of Patent: Oct. 31, 2017

(54) PRINTED CIRCUIT BOARD HAVING FUNCTION OF DETECTING DETERIORATION AND MOTOR DRIVE HAVING THE SAME

(71) Applicant: FANUC CORPORATION, Yamanashi (JP)

(72) Inventors: Yasuyuki Matsumoto, Yamanashi (JP); Kiichi Inaba, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/189,101

(22) Filed: Jun. 22, 2016

(65) Prior Publication Data
US 2017/0013709 A1  Jan. 12, 2017

(30) Foreign Application Priority Data
Jul. 8, 2015  (JP) .................................. 2015-137292

(51) Int. Cl.
*G01R 31/40* (2014.01)
*G01R 31/3187* (2006.01)
(Continued)

(52) U.S. Cl.
CPC ......... *H05K 1/0268* (2013.01); *H05K 1/0272* (2013.01); *H05K 1/09* (2013.01); *H05K 1/181* (2013.01)

(58) Field of Classification Search
CPC .............. G01R 1/0466; G01R 31/2806; G01R 31/2808; G01R 31/2841; G01R 31/2889;
(Continued)

(56) References Cited

U.S. PATENT DOCUMENTS

| | | | | | |
|---|---|---|---|---|---|
| 4,546,309 | A | * | 10/1985 | Kang | ................... G01R 31/086 324/509 |
| 2004/0113633 | A1 | * | 6/2004 | Kim | ...................... G01R 27/06 324/642 |
| 2016/0088723 | A1 | * | 3/2016 | Chung | ................... H05K 1/144 361/803 |

FOREIGN PATENT DOCUMENTS

| JP | H0743235 U | 8/1995 |
|---|---|---|
| JP | 1062476 A | 3/1998 |

OTHER PUBLICATIONS

English Abstract and Machine Translation for Japanese Publication No. 10-062476 A, published Mar. 6, 1998, 17 pgs.
(Continued)

*Primary Examiner* — Tung X Nguyen
(74) *Attorney, Agent, or Firm* — Fredrikson & Byron, P.A.

(57) ABSTRACT

A printed circuit board according to an embodiment of the present invention is formed of an insulating material and configured to mount components and wiring thereon. The printed circuit board includes a liquid pool for storing a liquid; a pair of deterioration detection traces one of which is connected to a power supply at one end and disposed in the liquid pool at the other end, and the other of which is connected to a ground at one end through a resistor and disposed in the liquid pool at the other end; a voltage detection circuit for detecting a voltage between the one ends of the one and the other deterioration detection traces; and a deterioration determination circuit for determining, based on the detected voltage, whether or not insulation deteriorates between the other ends of the one and the other deterioration detection traces.

10 Claims, 16 Drawing Sheets

(51) Int. Cl.
*H05K 1/02* (2006.01)
*H05K 1/18* (2006.01)
*H05K 1/09* (2006.01)

(58) Field of Classification Search
CPC .............. G01R 19/257; G01R 31/2884; G01R 31/3004; G01R 31/3181; G01R 31/31813
See application file for complete search history.

(56) References Cited

OTHER PUBLICATIONS

English Machine Translation for Japanese Publication No. JPH07-043235 U, published Aug. 18, 1995, 7 pgs.

* cited by examiner

PRINTED CIRCUIT BOARD HAVING FUNCTION OF DETECTING DETERIORATION AND MOTOR DRIVE HAVING THE SAME

BACKGROUND OF THE INVENTION

1. Field of the Invention

The present invention relates to a printed circuit board and a motor drive having the printed circuit board, and in particular relates to a printed circuit board having the function of detecting a deterioration in components and the like mounted on the printed circuit board owing to a water-soluble or water-insoluble cutting fluid or the like, and a motor drive having the printed circuit board.

2. Description of Related Art

Printed circuit boards and components mounted on the printed circuit boards are contaminated with time by dust or machining fluids such as water-soluble or water-insoluble cutting fluids or grinding fluids (hereinafter also called "water-soluble or water-insoluble cutting fluid or the like" or "electrolytic solution"), and may have operation malfunctions. For example, when conductive foreign matter such as a cutting fluid or swarf adheres between pins of an IC chip mounted on a printed circuit board, the foreign matter may reduce the insulation resistance between the pins and cause an electrical malfunction. If the adhering foreign matter is corrodible, the foreign matter may break a conductive pattern of the printed circuit board and cause a malfunction.

With miniaturization of electronic components in recent years, the components have been mounted more densely and printed circuit boards have had finer and denser patterns. In such printed circuit boards, external environmental factors, more specifically, water-soluble cutting fluids may cause corrosion in the wiring patterns of the printed circuit boards or malfunctions in the components with a lapse of time.

Thus, methods for detecting a deterioration in a printed circuit board owing to external environmental factors including corrodible gases, dust, and the like are proposed (for example, Japanese Unexamined Patent Publication (Kokai) No. 10-62476, hereinafter referred to as "Patent Literature 1"). Patent Literature 1 discloses a deterioration detection device of a printed circuit board for electronic equipment. The deterioration detection device includes deterioration detection traces and a deterioration determining and warning means. The deterioration detection traces having a predetermined conductor width are provided on the printed circuit board so as to be exposed to atmosphere. The deterioration detection traces are each energized with a predetermined voltage from a power supply at a predetermined impedance. The deterioration determining and warning means detects a trace voltage that is a voltage between predetermined two points distant in a longitudinal direction of the trace at predetermined time intervals, and obtains data that indicates at least the narrowness of the trace from detection data of the pattern voltage. The deterioration determining and warning means outputs a warning signal, when the data indicating the narrowness exceeds one threshold value or each of a plurality of threshold values. As described above, the invention described in Patent Literature 1 detects deterioration in the printed circuit board from an increase in the impedance of the deterioration detection trace that has been narrowed owing to corrosion, by measuring a voltage across the deterioration detection trace provided on the printed circuit board.

However, the conventional art described in Patent Literature 1 is intended not for water-soluble or water-insoluble cutting fluids but mainly for corrodible gases. Also, the conventional art does not have a mechanism for storing fluid materials such as water-soluble or water-insoluble cutting fluids, and therefore causes deteriorations to proceed concurrently in other components and wiring traces.

SUMMARY OF THE INVENTION

The present invention aims to provide a printed circuit board having a voltage detection circuit to solve such problems, that is, a printed circuit board that can forecast the timing of the occurrence of a malfunction with reliability in accordance with environmental conditions in which equipment is installed.

A printed circuit board according to an embodiment of the present invention is formed of an insulating material and configured to mount a component and wiring thereon. The printed circuit board includes a liquid pool for storing a liquid such as a water-soluble or water-insoluble cutting fluid, or a liquid adhesion portion to which the liquid adheres; a pair of deterioration detection traces one of which is connected to a power supply at one end and disposed in the liquid pool or the liquid adhesion portion at the other end, and the other of which is connected to a ground at one end, in which a resistor is connected to one end of the power supply or one end of the ground, and disposed in the liquid pool or the liquid adhesion portion at the other end; a voltage detection circuit for detecting a voltage between the one end of the one of the deterioration detection traces and the one end of the other of the deterioration detection traces; and a deterioration determination circuit for determining, based on the detected voltage, whether or not insulation deteriorates between the other end of the one of the deterioration detection traces and the other end of the other of the deterioration detection traces.

BRIEF DESCRIPTION OF THE DRAWINGS

The objects, features, and advantages of the present invention will be more apparent from the following description of embodiments in conjunction with the attached drawings, wherein.

DETAILED DESCRIPTION OF THE INVENTION

A printed circuit board and a motor drive according to the present invention will be described below with reference to drawings.

First Embodiment

Figure 1:
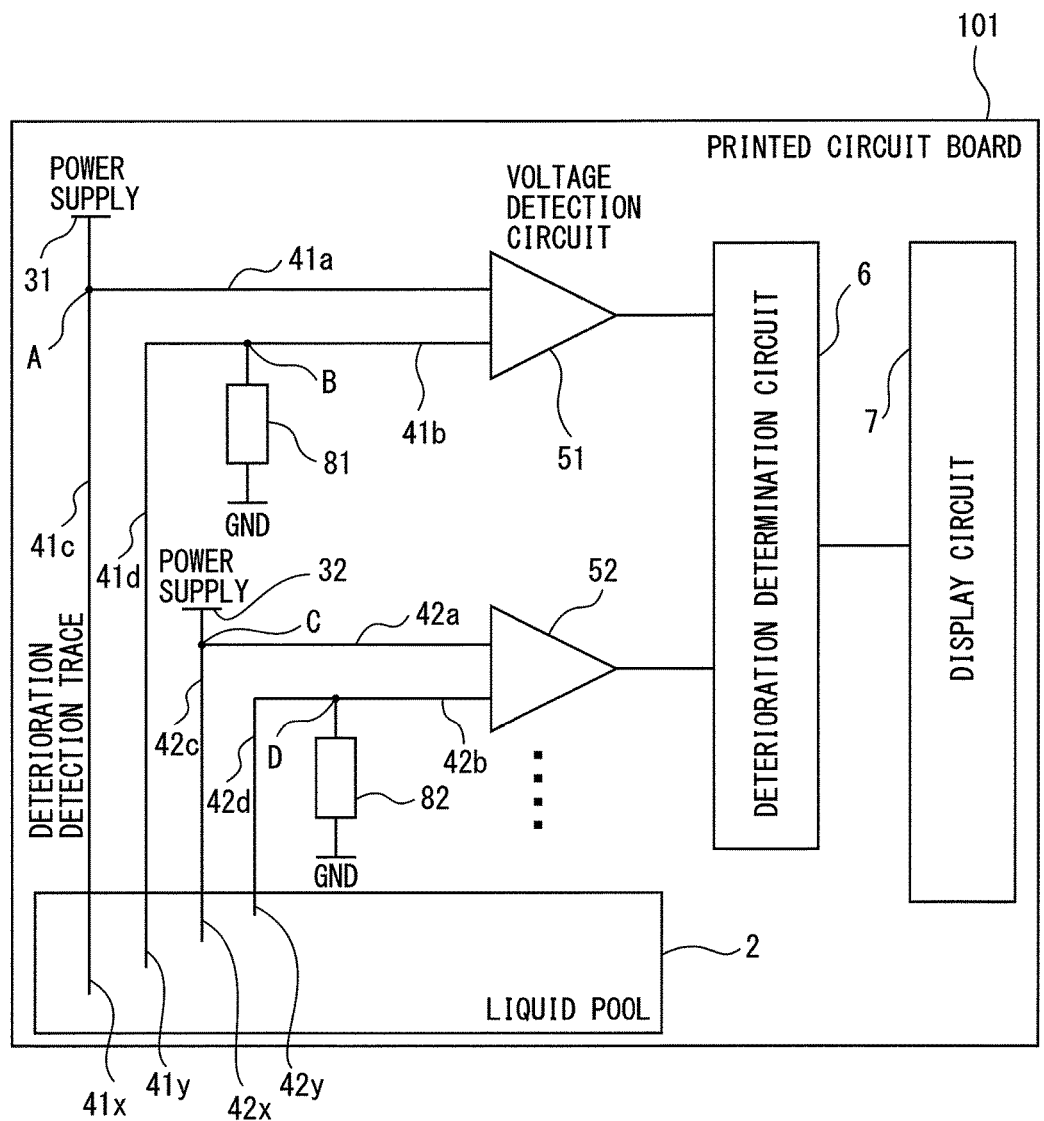
FIG. 1 is a block diagram of a printed circuit board according to a first embodiment of the present invention.

A printed circuit board according to a first embodiment of the present invention will be described. FIG. 1 is a block diagram of the printed circuit board according to the first embodiment of the present invention. A printed circuit board 101 according to the first embodiment of the present invention is a printed circuit board that is formed of an insulating material and has components and wiring mounted thereon. The printed circuit board 101 includes a liquid pool 2, a pair of deterioration detection traces 41$c$ and 41$d$, a voltage detection circuit 51, and a deterioration determination circuit 6.

The liquid pool 2 stores a liquid such as a water-soluble or water-insoluble cutting fluid. The liquid pool 2 has, for example, a pocket-like structure.

FIG. 1 shows an example having two groups of a pair of deterioration detection traces and a voltage detection circuit. However, not limited to this example, one or three or more groups of a pair of deterioration detection traces and a voltage detection circuit may be provided.

As for the structure of the first group, the deterioration detection trace 41$c$ is connected to a power supply 31 at one end at a contact A, and disposed in the liquid pool 2 at the other end 41$x$. The deterioration detection trace 41$d$ is connected to a ground (GND) through a resistor 81 at one end at a contact B, and disposed in the liquid pool 2 at the other end 41$y$. Note that, FIG. 1 shows an example in which the resistor 81 is connected to the ground, but not limited thereto. The resistor may be connected to the power supply 31, or both of the power supply 31 and the ground. As for the structure of the second group, in a like manner, a deterioration detection trace 42$c$ is connected to a power supply 32 at one end at a contact C, and disposed in the liquid pool 2 at the other end 42$x$. The other deterioration detection trace 42$d$ is connected to a ground (GND) at one end at a contact D, and disposed in the liquid pool 2 at the other end 42$y$.

The first voltage detection circuit 51 detects a voltage between the one end of the deterioration detection trace 41$c$ and the one end of the deterioration detection trace 41$d$. More specifically, the voltage detection circuit 51 measures a voltage between the two contacts A and B. The contact A is connected to the voltage detection circuit 51 through a trace 41$a$. The contact B is connected to the voltage detection circuit 51 through a trace 41$b$. The second voltage detection circuit 52 detects a voltage between the one end of the deterioration detection trace 42$c$ and the one end of the deterioration detection trace 42$d$. More specifically, the voltage detection circuit 52 measures a voltage between the two contacts C and D. The contact C is connected to the voltage detection circuit 52 through a trace 42$a$. The contact D is connected to the voltage detection circuit 52 through a trace 42$b$. The voltage detection circuits 51 and 52 each include an A/D converter, an operational amplifier, or a comparator. The A/D converter, the operational amplifier, or the comparator detects a voltage between the trace 41$a$ connected to the deterioration detection trace 41$c$ and the trace 41$b$ connected to the deterioration detection trace 41$d$, or between the trace 42$a$ connected to the deterioration detection trace 42$c$ and the trace 42$b$ connected to the deterioration detection trace 42$d$, and converts the detected voltage into a digital value.

The deterioration determination circuit 6 determines whether or not insulation between the other end 41$x$ of the deterioration detection trace 41$c$ and the other end 41$y$ of the deterioration detection trace 41$d$ and between the other end 42$x$ of the deterioration detection trace 42$c$ and the other end 42$y$ of the deterioration detection trace 42$d$ is deteriorated based on the voltages detected by the voltage detection circuits 51 and 52, respectively.

The deterioration determination circuit 6 analyzes and determines a deterioration state of the printed circuit board 101 from a variation in the voltage between the traces based on detected voltage data converted by and outputted from the A/D converter provided in each of the voltage detection circuits 51 and 52. When nothing stands in the liquid pool 2 for storing the water-soluble or water-insoluble cutting fluid or the like, in general, impedance becomes infinite and thus the voltages between the deterioration detection traces 41$c$ and 41$d$ and between the deterioration detection traces 42$c$ and 42$d$ are equal to power supply voltages. On the other hand, when the water-soluble or water-insoluble cutting fluid, conductive foreign matter, or the like stands in the liquid pool 2, insulation resistance is reduced and a leak current flows through the deterioration detection traces. A divided voltage between the existing resistor 81 or 82 and the resistance of a mechanism section (not shown) is measured, and this results in a determination of the deterioration state.

In the example shown in FIG. 1, the other ends 41$x$ and 41$y$ of one of the two pairs of deterioration detection traces are situated closer to the bottom surface of the liquid pool 2 than the other ends 42$x$ and 42$y$ of the other pair of deterioration detection traces. Thus, as the liquid such as the water-soluble or water-insoluble cutting fluid collects on the bottom surface, the resistance between the other ends 41$x$ and 41$y$ is first reduced, and the resistance between the other ends 42$x$ and 42$y$ is next reduced. As a result, the voltage detected by the voltage detection circuit 51 is first reduced, and the voltage detected by the voltage detection circuit 52 is next reduced. As described above, disposing the terminals of the plurality of deterioration detection traces at different heights in the liquid pool allows a grasp of a liquid level in the liquid pool.

A display circuit 7 displays a result or outputs a warning in accordance with the determination result of the deterioration determination circuit 6.

As a method for analyzing the detected voltage, a method in which whether or not an index of insulation deterioration exceeds a predetermined threshold value is determined is conceivable. As the index of insulation deterioration, the detected voltage itself, the amount of impedance (resistance, in this case), a difference between the detected voltage or the amount of impedance and an initial value thereof, or the ratio of the detected voltage or the amount of impedance to the initial value thereof is available. In other words, the deterioration determination circuit 6 may determine the presence or absence of insulation deterioration based on one of the voltage value detected by each of the voltage detection circuits 51 and 52 and a difference between the detected voltage value and a predetermined voltage value. As the predetermined voltage value, an initial voltage value, a voltage value established in advance, the average of voltage values measured in the past, or the like is available. As for the threshold value, establishing a plurality of threshold values in increasing or decreasing order of size allows determining the level of the index of insulation deterioration.

Figure 2A:
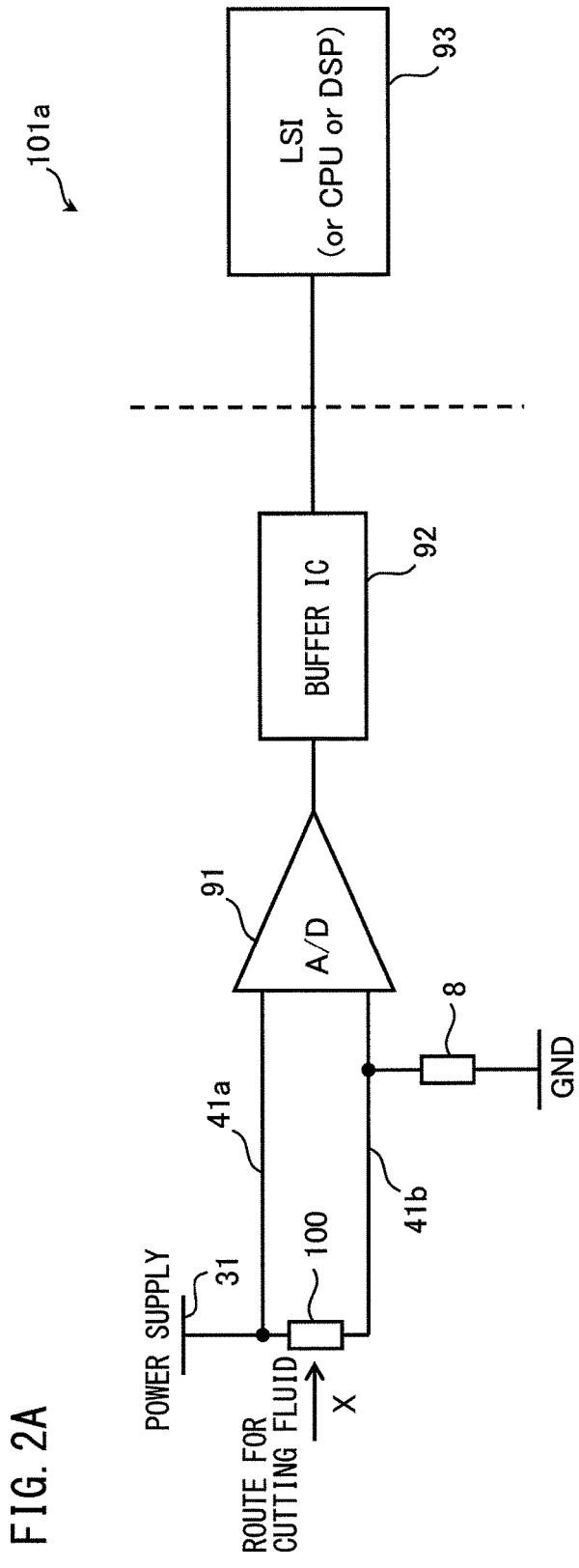
FIG. 2A is a block diagram of a printed circuit board according to a first modification example of the first embodiment of the present invention.

Next, modification examples of the printed circuit board according to the first embodiment of the present invention will be described. FIG. 2A is a block diagram of a printed circuit board according to the first modification example of the first embodiment of the present invention. A printed circuit board 101a according to the first modification example is a printed circuit board that is formed of an insulating material and has components and wiring mounted thereon. The printed circuit board 101a includes a liquid adhesion portion 100, a pair of deterioration detection traces 41a and 41b, a voltage detection circuit, and a deterioration determination circuit. A liquid adheres to the liquid adhesion portion 100. The deterioration detection trace 41a is connected to a power supply 31 at one end, and disposed in the liquid adhesion portion 100 at the other end. The deterioration detection trace 41b is connected to a ground at one end, and disposed in the liquid adhesion portion 100 at the other end. A resistor 8 is connected to one end of the power supply 31 or one end of the ground. The voltage detection circuit includes an A/D converter 91 for detecting a voltage between the one end of the deterioration detection trace 41a and the one end of the deterioration detection trace 41b, and a buffer IC 92. The deterioration determination circuit has an LSI (or CPU or DSP) 93 that determines, based on the detected voltage, whether or not insulation between the other end of the deterioration detection trace 41a and the other end of the deterioration detection trace 41b is deteriorated.

Figure 2B:
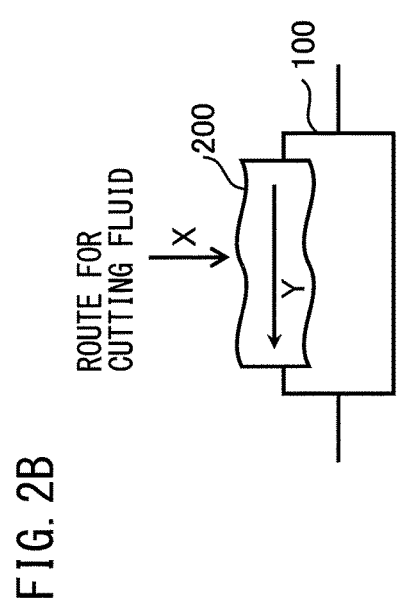
FIG. 2B is a diagram that shows a route for a cutting fluid adhering to a liquid adhesion portion in the printed circuit board according to the first modification example of the first embodiment of the present invention.

In the first modification example of the first embodiment, an electronic component is treated as a cutting fluid adhesion portion (liquid adhesion portion). As shown in FIG. 2B, since a cutting fluid 200 adheres to the liquid adhesion portion 100 along a route X, a leak current flows in the direction of an arrow Y, and thereby this results in detecting an insulation deterioration. The liquid adhesion portion 100 may be an electronic component such as a resistor, a capacitor, or an IC mounted on the printed circuit board. The liquid adhesion portion 100 may include a plurality of electronic components such as resistors, capacitors, or ICs.

In the first modification example, the deterioration determination circuit may be constituted of the LSI (or CPU or DSP) 93.

Figure 3:
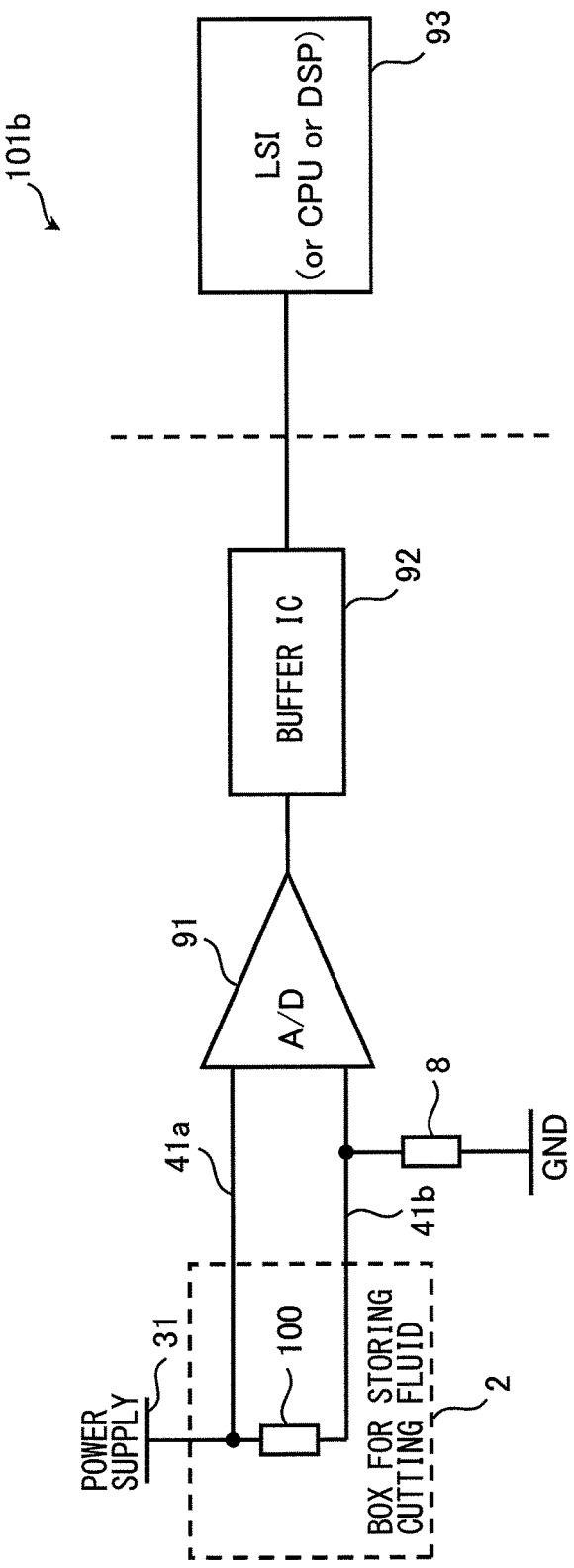
FIG. 3 is a block diagram of a printed circuit board according to a second modification example of the first embodiment of the present invention.

FIG. 3 is a block diagram of a printed circuit board according to a second modification example of the first embodiment of the present invention. In a printed circuit board 101b according to the second embodiment, a liquid adhesion portion 100 is provided in a liquid pool 2 that is a box to store a cutting fluid. The other configurations are the same as those of the first modification example. The provision of the liquid adhesion portion 100 inside the liquid pool 2 allows efficiently detecting corrosion of the printed circuit board owing to the cutting fluid.

Figure 4:
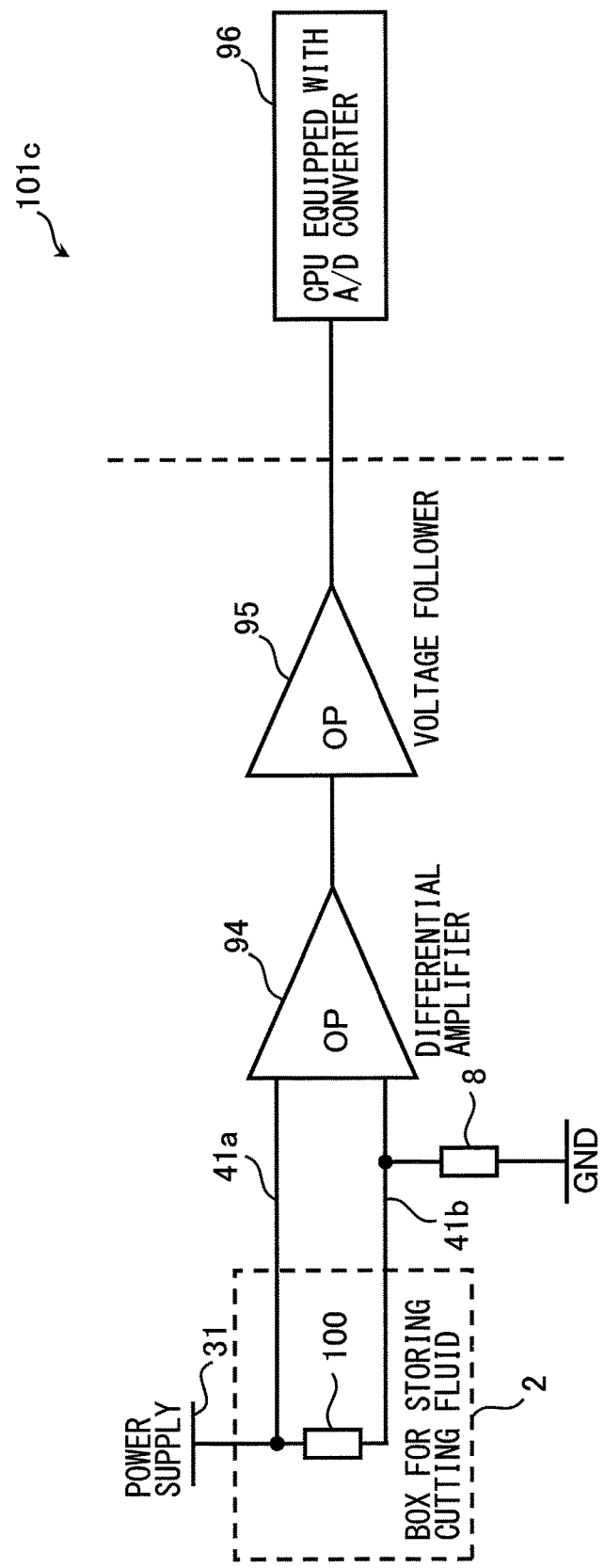
FIG. 4 is a block diagram of a printed circuit board according to a third modification example of the first embodiment of the present invention.

FIG. 4 is a block diagram of a printed circuit board according to a third modification example of the first embodiment of the present invention. In a printed circuit board 101c according to the third modification example, a differential amplifier circuit 94 and a voltage follower circuit 95 may be provided as a voltage detection circuit, and a CPU 96 equipped with an A/D converter may be provided as a deterioration determination circuit.

Figure 5:
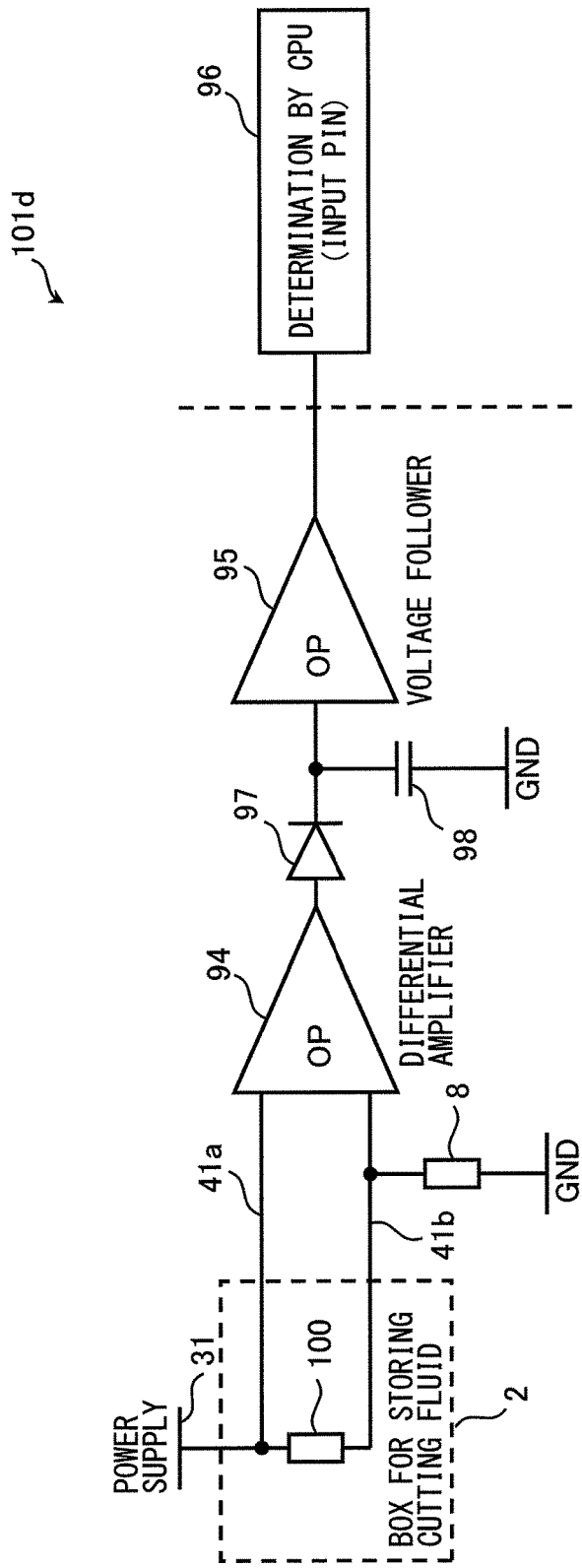
FIG. 5 is a block diagram of a printed circuit board according to a fourth modification example of the first embodiment of the present invention.

FIG. 5 is a block diagram of a printed circuit board according to a fourth modification example of the first embodiment of the present invention. In a printed circuit board 101d according to the fourth modification example, a differential amplifier circuit 94, a rectifier circuit having a diode 97 and a capacitor 98, and a voltage follower circuit 95 may be provided as a voltage detection circuit, and a CPU 96 may be provided as a deterioration determination circuit.

Figure 6:
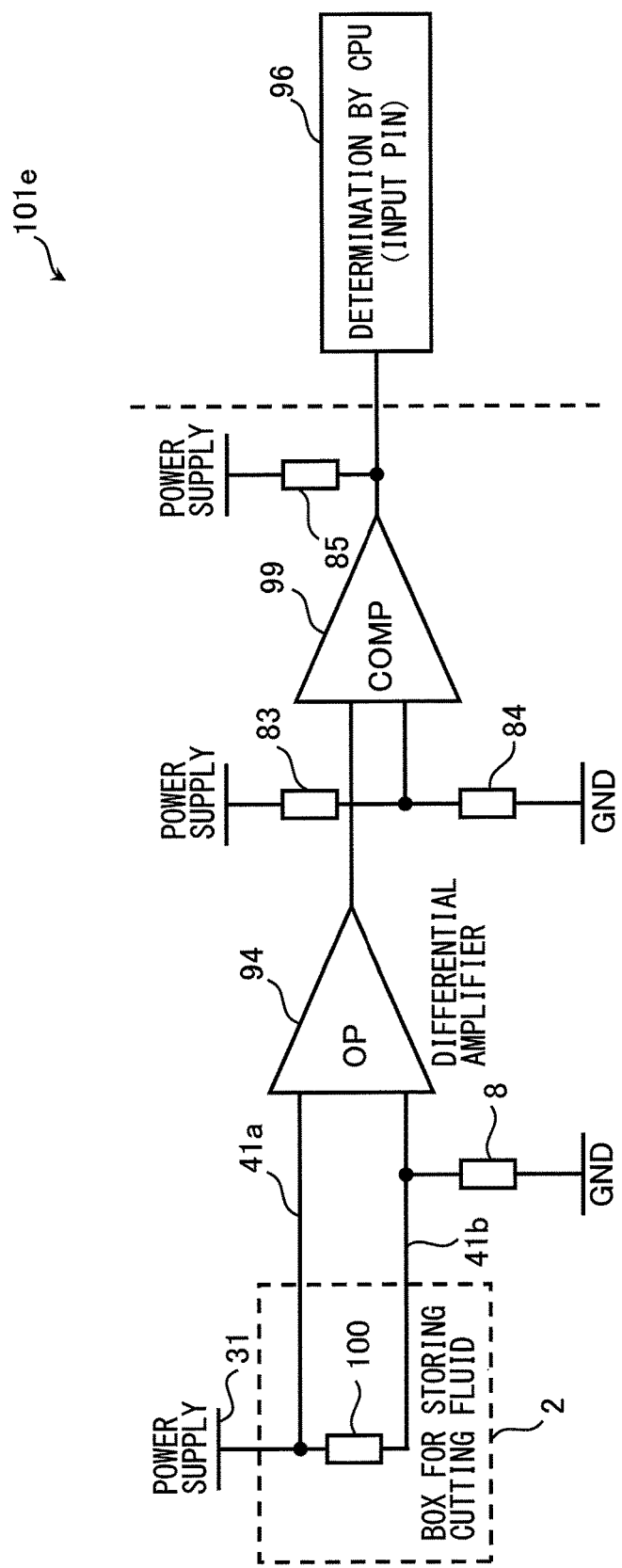
FIG. 6 is a block diagram of a printed circuit board according to a fifth modification example of the first embodiment of the present invention.

FIG. 6 is a block diagram of a printed circuit board according to a fifth modification example of the first embodiment of the present invention. In a printed circuit board 101e according to the fifth modification example, a differential amplifier circuit 94, resistors 83 to 85, and a comparator 99 may be provided as a voltage detection circuit, and a CPU 96 may be provided as a deterioration determination circuit.

The printed circuit board according to the first embodiment of the present invention is provided with the liquid pool 2 thereon that has a mechanism to store a water-soluble or water-insoluble cutting fluid or the like (electrolytic solution) in a route in which the water-soluble or water-insoluble cutting fluid or the like (electrolytic solution) is likely to adhere. In the printed circuit board, the plurality of pairs of deterioration detection traces 41c, 41d, 42c and 42d are disposed in a stepwise manner with respect to a depth direction of a portion in which the water-soluble or water-insoluble cutting fluid or the like (electrolytic solution) is stored. The printed circuit board measures a voltage between the deterioration detection traces in accordance with the amount of the stored water-soluble or water-insoluble cutting fluid or the like (electrolytic solution). According to the printed circuit board of the first embodiment of the present invention, a reduction in insulation resistance is measured in order to detect a deterioration in the printed circuit board. When a deterioration detection level exceeds a predetermined threshold value, the display circuit 7 is informed of the fact and therefore displays a warning or the like. In response to the warning, an operator replaces the printed circuit board or reviews an installation environment of the printed circuit board. In such an environment, preventive maintenance for the printed circuit board is effectively performed, thus serving to prevent a malfunction of the motor drive before it happens, caused by the water-soluble or water-insoluble cutting fluid or the like.

Second Embodiment

Figure 7:
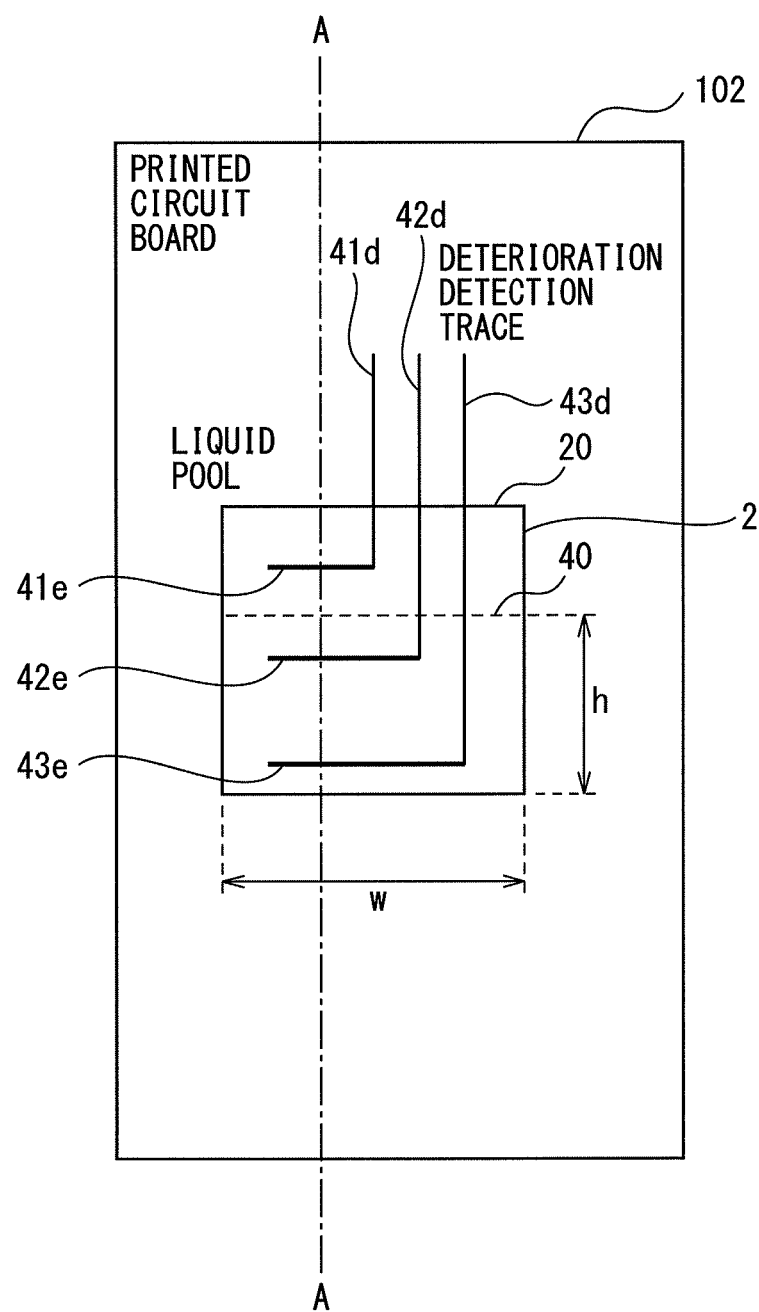
FIG. 7 is a schematic diagram of a printed circuit board according to a second embodiment of the present invention.

Next, a printed circuit board according to a second embodiment of the present invention will be described. FIG. 7 is a schematic diagram of the printed circuit board according to the second embodiment of the present invention. The difference between a printed circuit board 102 according to the second embodiment of the present invention and the printed circuit board 101 according to the first embodiment is that the liquid pool 2 is in the shape of a box having an opening 20 in its top and a constant width w in a horizontal direction to a liquid surface 40 irrespective of the height h of the liquid surface, and that a plurality of pairs of deterioration detection traces 41d, 42d and 43d are provided and ends 41e, 42e and 43e of the plurality of pairs of deterioration detection traces are situated in different positions in a height direction of the liquid surface. The other configurations of the printed circuit board 102 according to the second embodiment are the same as those of the printed circuit board 101 according to the first embodiment, so a detailed description thereof will be omitted.

As shown in FIG. 7, since the liquid pool 2 for storing a water-soluble or water-insoluble cutting fluid or the like has the constant width and the ends 41e, 42e and 43e of the deterioration detection traces are situated in the different positions, correspondences are established between the pair of deterioration detection traces and the amount of the water-soluble or water-insoluble cutting fluid or the like that has flowed into the liquid pool 2, thus allowing establishing a plurality of insulation deterioration levels. The height of the liquid pool 2 in an orthogonal direction to the printed circuit board 102 may be varied. Note that, ends that are paired with the ends 41e, 42e and 43e of the deterioration detection traces, respectively, are omitted in FIG. 7.

Figure 8:
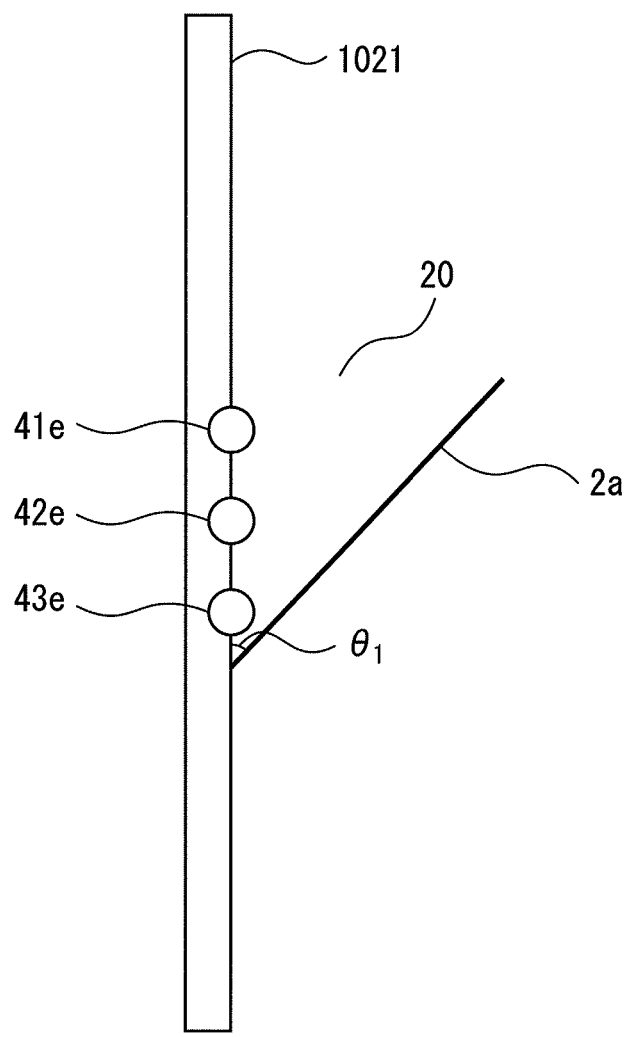
FIG. 8 is a sectional view of an example of the printed circuit board according to the second embodiment of the present invention.
Figure 9:
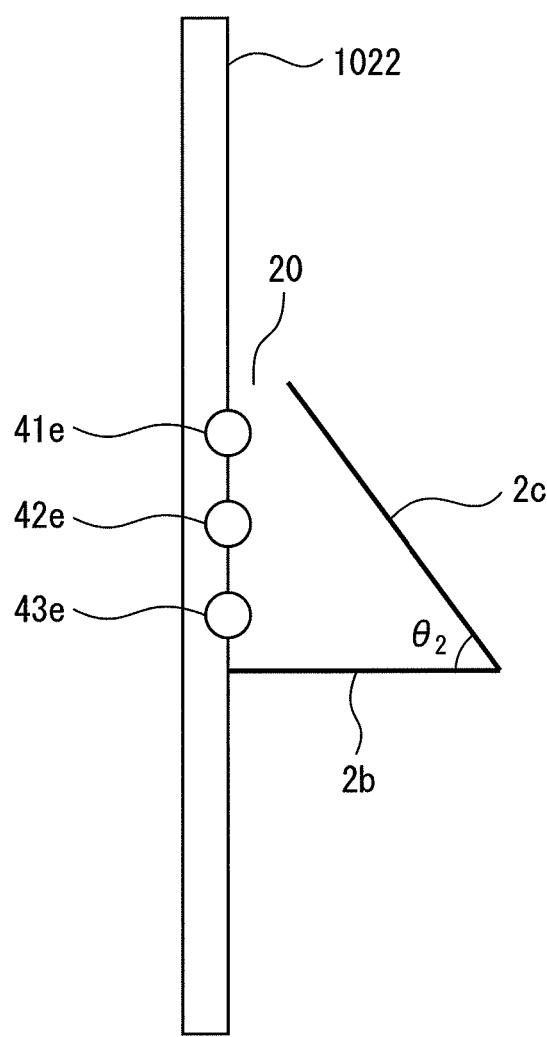
FIG. 9 is a sectional view of another example of the printed circuit board according to the second embodiment of the present invention.
Figure 10:
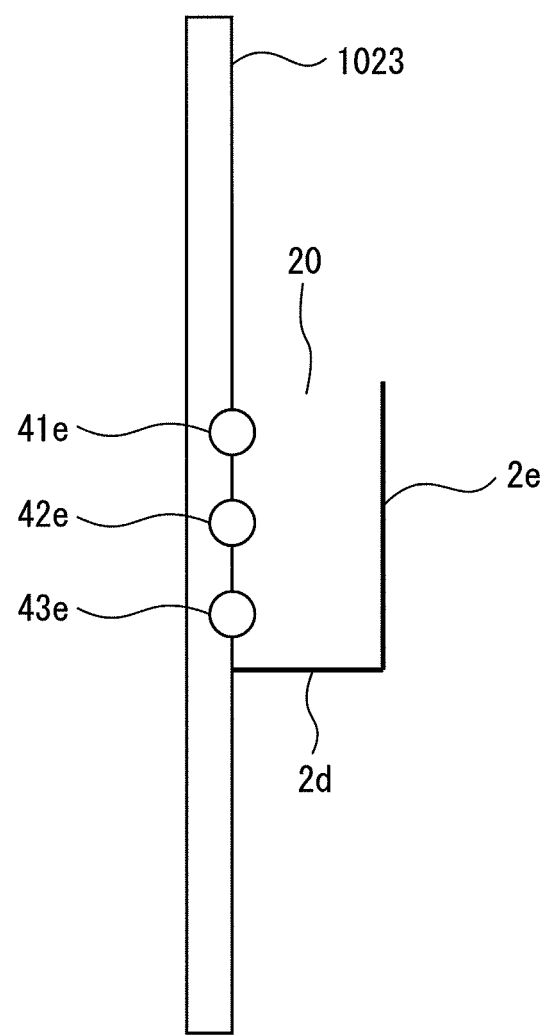
FIG. 10 is a sectional view of yet another example of the printed circuit board according to the second embodiment of the present invention.

FIGS. 8 to 10 are sectional views taken along a line A-A in FIG. 7. FIG. 8 is a sectional view of an example of the printed circuit board according to the second embodiment of the present invention. FIG. 8 shows only a printed circuit board 1021, the ends 41e, 42e and 43e of the deterioration detection traces, and a front surface 2a of the liquid pool 2. The front surface 2a of the liquid pool 2 is seen when the printed circuit board 1021 is viewed from an orthogonal direction. For example, the front surface 2a may form an angle $\theta_1$ with the printed circuit board 1021. As the water-soluble or water-insoluble cutting fluid or the like is flowing from the opening 20 and accumulating in the liquid pool 2, a voltage drop is first detected at the end 43e, second detected at the end 42e, and last detected at the end 41e. As a result, the amount of the water-soluble or water-insoluble cutting fluid or the like accumulated in the liquid pool 2 can be estimated based on at which of the ends 41e, 42e and 43e the voltage drop is detected. The sharper the angle $\theta_1$, the smaller amount of liquid can be detected.

FIG. 9 is a sectional view of another example of the printed circuit board according to the second embodiment of the present invention. A bottom surface 2b of the liquid pool 2 is approximately perpendicular to a printed circuit board 1022. A front surface 2c of the liquid pool 2 forms an angle $\theta_2$ with the bottom surface 2b. When the angle $\theta_2$ is less than 90°, the opening 20 is smaller than the bottom surface 2b in size. For example, in a case where the liquid pool 2 is filled with a significant amount of liquid in a short time, the angle $\theta_2$ is regulated to reduce the size of the opening 20.

FIG. 10 is a sectional view of yet another example of the printed circuit board according to the second embodiment of the present invention. A bottom surface 2d of the liquid pool 2 is approximately perpendicular to a printed circuit board 1023. A front surface 2e of the liquid pool 2 is approximately horizontal to the printed circuit board 1023.

As described above, the printed circuit board of the second embodiment is provided with the deterioration detection traces that have correspondences with the amount of a water-soluble or water-insoluble cutting fluid or the like having flowed into the liquid pool, thus allowing establishing a plurality of insulation deterioration levels.

Third Embodiment

Figure 11:
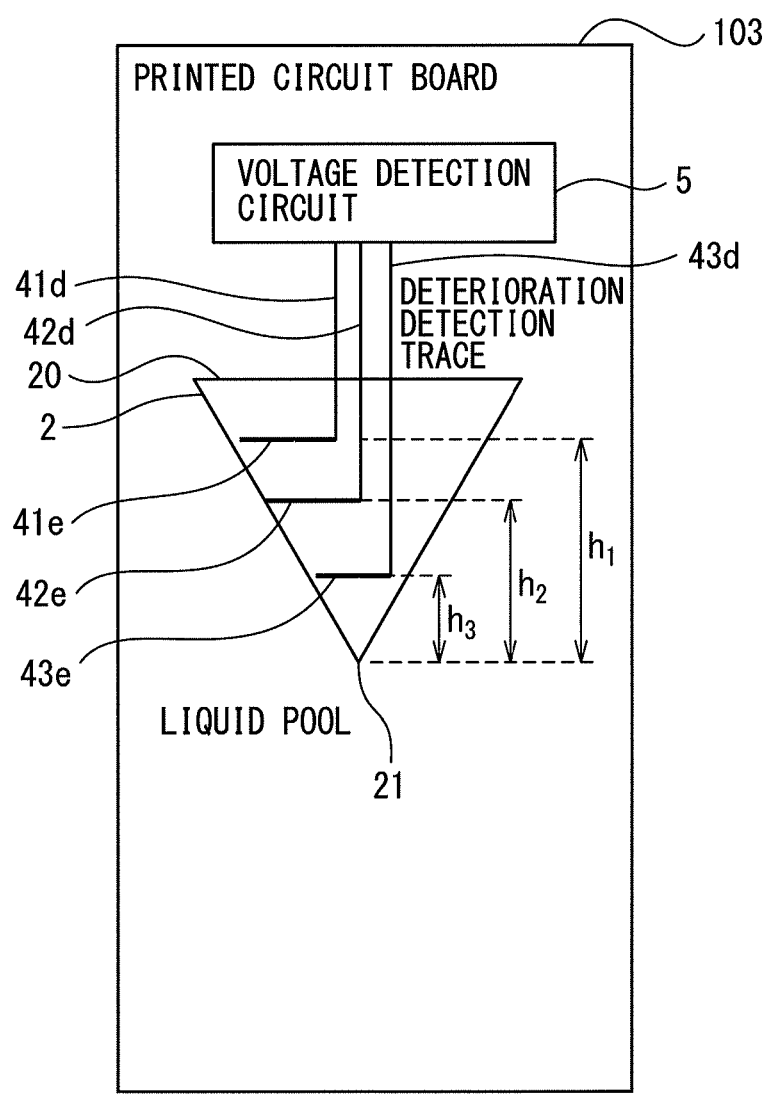
FIG. 11 is a schematic diagram of a printed circuit board according to a third embodiment of the present invention.

Next, a printed circuit board according to a third embodiment of the present invention will be described. FIG. 11 is a schematic diagram of the printed circuit board according to the third embodiment of the present invention. The difference between a printed circuit board 103 according to the third embodiment of the present invention and the printed circuit board 101 according to the first embodiment is that the liquid pool 2 is in the shape of a box having an opening 20 in its top and a varying width w in a horizontal direction to a liquid surface in accordance with the height of the liquid surface, and that a plurality of pairs of deterioration detection traces 41d, 42d and 43d are provided and ends 41e, 42e and 43e of the plurality of pairs of deterioration detection traces are situated in different positions in a height direction of the liquid surface. The other configurations of the printed circuit board 103 according to the third embodiment are the same as those of the printed circuit board 101 according to the first embodiment, so a detailed description thereof will be omitted.

As shown in FIG. 11, the end 41e is situated at a height $h_1$ from the bottom 21 of the liquid pool 2. The end 42e is situated at a height $h_2$ from the bottom 21 of the liquid pool 2. The end 43e is situated at a height $h_3$ from the bottom 21 of the liquid pool 2. Since the heights are set at $h_1 > h_2 > h_3$, as a liquid is accumulating in the liquid pool 2, the end 43e first contacts the liquid and a voltage drop is detected thereat, the end 42e second contacts the liquid and a voltage drop is detected thereat, and the end 41e last contacts the liquid and a voltage drop is detected thereat. As a result, the amount of a water-soluble or water-insoluble cutting fluid or the like accumulated in the liquid pool 2 can be estimated based on at which of the ends 41e, 42e and 43e the voltage drop is detected.

Figure 12:
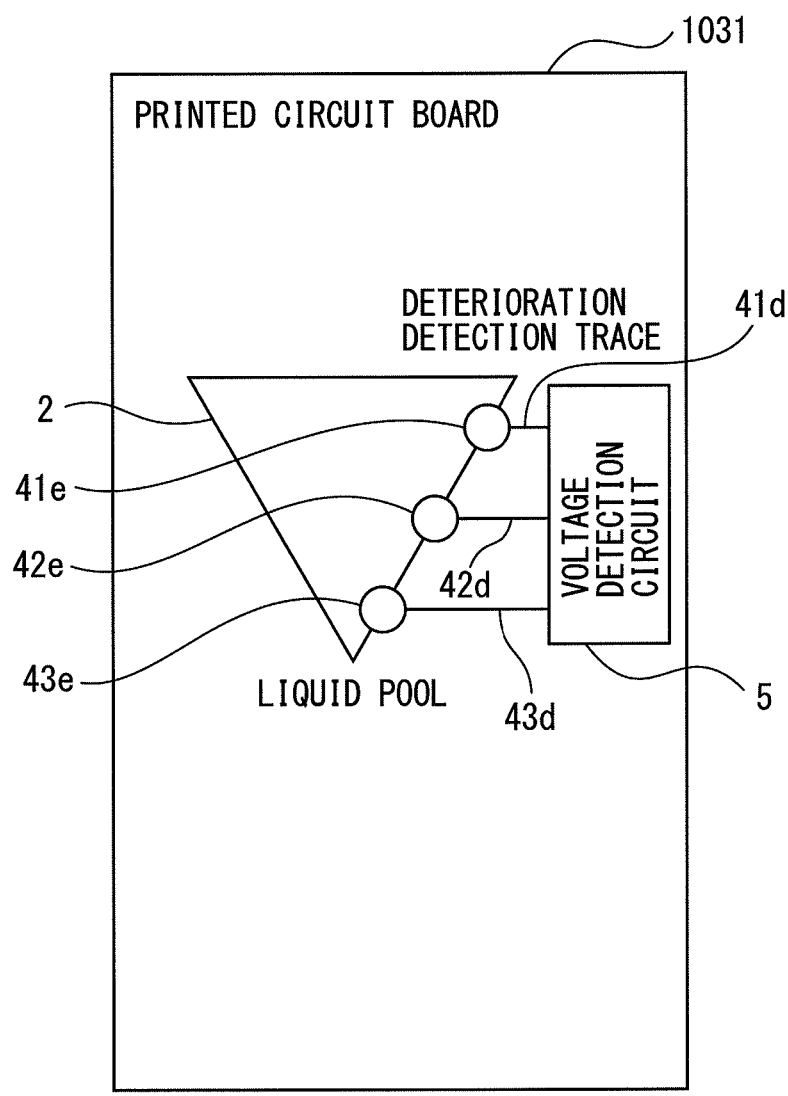
FIG. 12 is a schematic diagram of a modification example of the printed circuit board according to the third embodiment of the present invention.

FIG. 12 shows a modification example of the printed circuit board according to the third embodiment of the present invention. Just as with a printed circuit board 1031 shown in FIG. 12, the ends 41e, 42e and 43e may be disposed in a side surface of the liquid pool 2. By disposing the deterioration detection traces 41d, 42d and 43d horizontally to the liquid surface of the liquid pool 2, the distance from the ends 41e, 42e and 43e to a voltage detection circuit 5 becomes short.

As described above, according to the printed circuit board of the third embodiment, the width of the liquid pool is gradually widened or narrowed. Therefore, it is possible to provide the ends of the deterioration detection traces that have correspondences with the amount of a water-soluble or water-insoluble cutting fluid or the like having flowed into the liquid pool, thus allowing establishing a plurality of insulation deterioration levels.

Fourth Embodiment

Figure 13:
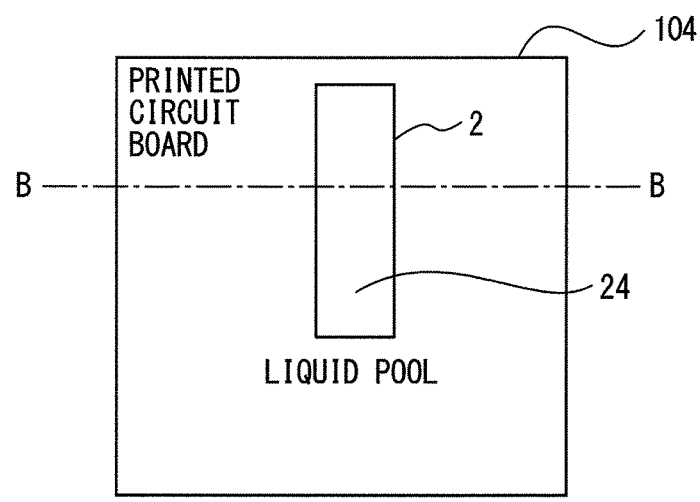
FIG. 13 is a plan view of a liquid pool in a printed circuit board according to a fourth embodiment of the present invention.

Next, a printed circuit board according to a fourth embodiment of the present invention will be described. FIG. 13 is a schematic diagram of the printed circuit board according to the fourth embodiment of the present invention. The difference between a printed circuit board 104 according to the fourth embodiment of the present invention and the printed circuit board 101 according to the first embodiment is that the liquid pool 2 has a groove 24 to store a liquid, formed on the printed circuit board 104. The other configurations of the printed circuit board 104 according to the fourth embodiment are the same as those of the printed circuit board 101 according to the first embodiment, so a detailed description thereof will be omitted.

Figure 14:
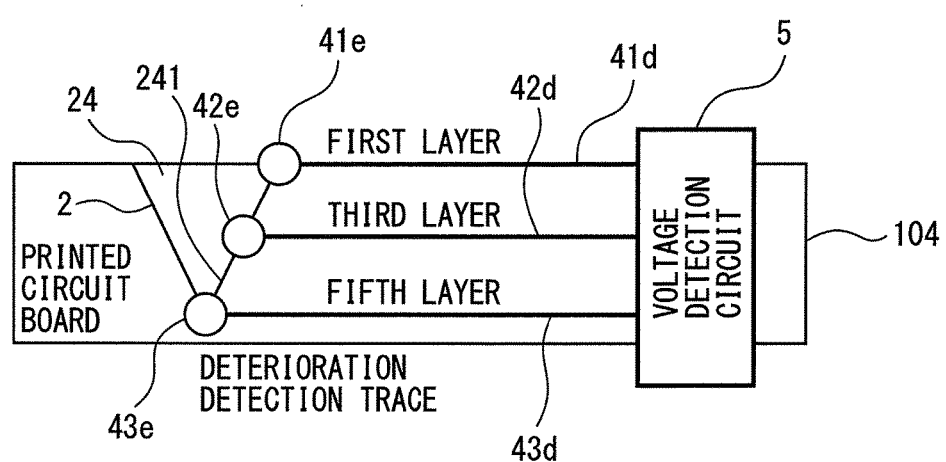
FIG. 14 is a sectional view of the liquid pool in the printed circuit board according to the fourth embodiment of the present invention.

FIG. 14 is a sectional view taken on a line B-B in FIG. 13. The printed circuit board 104 is a multilayer printed circuit board having a plurality of pairs of deterioration detection traces 41*d*, 42*d* and 43*d*. In the groove 24 of the liquid pool 2, at least one of the plurality of pairs of deterioration detection traces 41*d*, 42*d* and 43*d* is disposed in each of different layers of the printed circuit board 104. In an example shown in FIG. 14, ends 41*e*, 42*e* and 43*e* of the deterioration detection traces 41*d*, 42*d* and 43*d* are formed in a side surface 241 of the groove 24. The deterioration detection traces 41*d*, 42*d* and 43*d* and the ends 41*e*, 42*e* and 43*e* are formed in a first layer, a third layer, and a fifth layer of the printed circuit board 104, respectively. However this is just an example, and the deterioration detection traces and the ends may be formed in other layers.

According to the printed circuit board of the fourth embodiment, the liquid pool for storing a water-soluble or water-insoluble cutting fluid or the like is made of the groove formed on the printed circuit board, and the deterioration detection traces extend from the formed groove, thereby allowing establishing a plurality of insulation deterioration levels.

Fifth Embodiment

Figure 15:
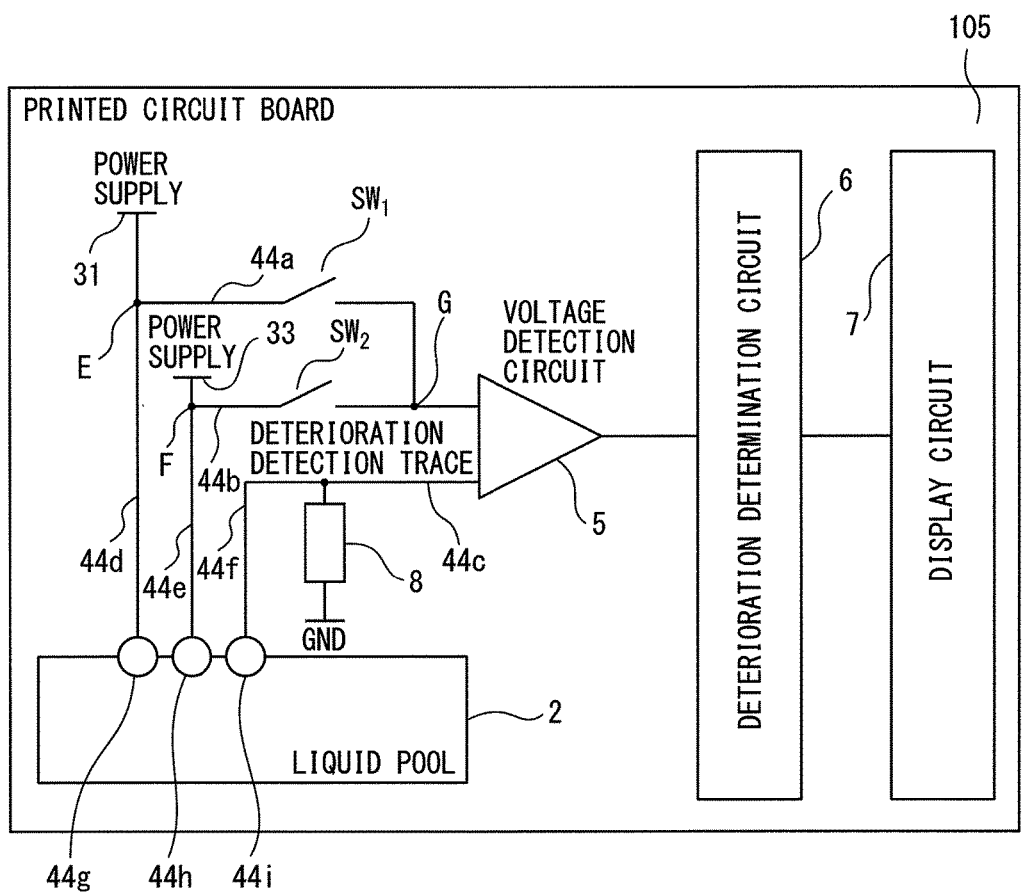
FIG. 15 is a block diagram of a printed circuit board according to a fifth embodiment of the present invention.

Next, a printed circuit board according to a fifth embodiment of the present invention will be described. FIG. 15 is a block diagram of the printed circuit board according to the fifth embodiment of the present invention. The difference between a printed circuit board 105 according to the fifth embodiment of the present invention and the printed circuit board 101 according to the first embodiment is that a plurality of deterioration detection traces 44*d* and 44*e* one end of each of which is connected to a power supply and the other end of each of which is disposed in a liquid pool 2 are connected to a voltage detection circuit 5 through switches $SW_1$ and $SW_2$, respectively, and the switches $SW_1$ and $SW_2$ are used for switching which deterioration detection trace to connect to the voltage detection circuit 5. The other configurations of the printed circuit board 105 according to the fifth embodiment are the same as those of the printed circuit board 101 according to the first embodiment, so a detailed description thereof will be omitted.

As shown in FIG. 15, the deterioration detection trace 44*d* connected to a power supply 31 and the deterioration detection trace 44*e* connected to a power supply 33 are connected to the common voltage detection circuit 5. More specifically, the deterioration detection trace 44*d* is connected to a trace 44*a* at a contact E and to the voltage detection circuit 5 through the switch $SW_1$. The deterioration detection trace 44*e* is connected to a trace 44*b* at a contact F and to the voltage detection circuit 5 through the switch $SW_2$. On the contrary, only one deterioration detection trace 44*f* is connected to a ground through a resistor 8 and to the voltage detection circuit 5 through a trace 44*c*.

An end 44*g* of the deterioration detection trace 44*d*, an end 44*h* of the deterioration detection trace 44*e*, and an end 44*i* of the deterioration detection trace 44*f* are made of materials having different insulation deterioration levels. To detect a deterioration at the end 44*g*, the switch $SW_1$ is turned on while the switch $SW_2$ is turned off. This enables deterioration detection using only the end 44*g*. Likewise, to detect deterioration at the end 44*h*, the switch $SW_1$ is turned off while the switch $SW_2$ is turned on. This enables deterioration detection using only the end 44*h*. To detect a deterioration using both of the ends 44*g* and 44*h*, both of the switches $SW_1$ and $SW_2$ are turned on.

According to the printed circuit board of the fifth embodiment, the one voltage detection circuit can process a plurality of insulation deterioration levels by switching the deterioration detection traces using the switches.

Sixth Embodiment

Figure 16:
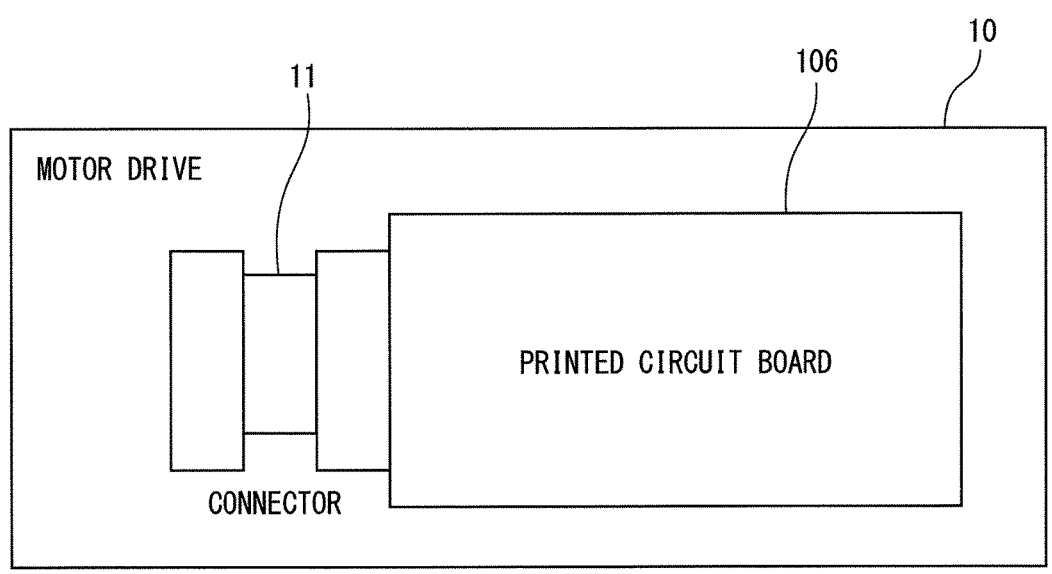
FIG. 16 is a block diagram of a motor drive according to a sixth embodiment of the present invention.

Next, a motor drive according to a sixth embodiment of the present invention will be described. FIG. 16 is a block diagram of the motor drive according to the sixth embodiment of the present invention. A motor drive 10 according to the sixth embodiment of the present invention includes the printed circuit board according to any of the first to fifth embodiments described above. This printed circuit board 106 is preferably replaceable through a connector 11.

In a case where a voltage detection circuit of a printed circuit board detects a malfunction owing to deterioration detection by the printed circuit board during operation, if the voltage detection circuit is directly mounted on a motor drive, the entire motor drive needs replacing in maintenance. Thus, a modular structure through the connector, just as with the motor drive according to the sixth embodiment, allows easy replacement.

Seventh Embodiment

Figure 17:
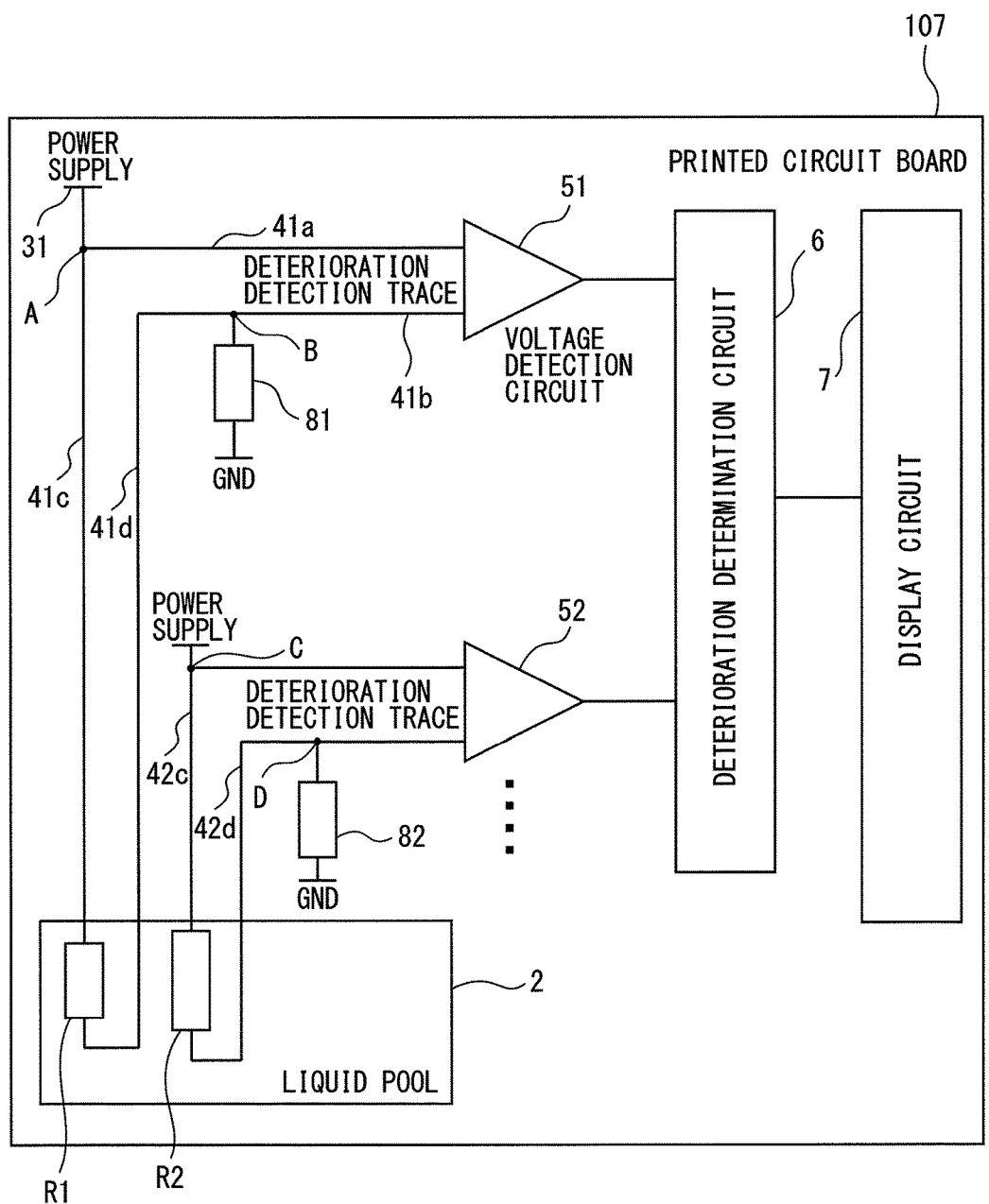
FIG. 17 is a block diagram of a printed circuit board according to a seventh embodiment of the present invention.

Next, a printed circuit board according to a seventh embodiment of the present invention will be described. FIG. 17 is a block diagram of the printed circuit board according to the seventh embodiment of the present invention. The difference between a printed circuit board 107 according to the seventh embodiment of the present invention and the printed circuit board 101 according to the first embodiment is that a deterioration detection resistor R1 is mounted inside a liquid pool 2 and ends of a pair of deterioration detection traces 41*c* and 41*d* are connected to both ends of the deterioration detection resistor R1. The other configurations of the printed circuit board 107 according to the seventh embodiment are the same as those of the printed circuit board 101 according to the first embodiment, so a detailed description thereof will be omitted.

According to the printed circuit board of the seventh embodiment of the present invention, since deterioration detection resistors R1 and R2 are disposed inside the liquid pool 2, insulation deterioration can be detected from a variation in a resistance value at the time when a water-soluble or water-insoluble cutting fluid or the like adheres to the resistor. Providing a plurality of resistors R1 and R2 of different sizes makes it possible to provide a plurality of insulation deterioration levels.

The printed circuit boards according to the embodiments of the present invention can forecast the timing of the occurrence of a malfunction with reliability in accordance with environmental conditions in which equipment is installed. As a result, it is possible to improve the availability of a machine in which the equipment is installed, and improve an environment in which the equipment is used and thereby perform preventive maintenance.

What is claimed is:

1. A printed circuit board formed of an insulating material and configured to mount a component and wiring thereon, the printed circuit board comprising:
    a liquid pool for storing a liquid including a water-soluble or water-insoluble cutting fluid, or a liquid adhesion portion to which the liquid adheres;
    a pair of deterioration detection traces one of which is connected to a power supply at one end and disposed in the liquid pool or the liquid adhesion portion at the other end, and the other of which is connected to a ground at one end, in which a resistor is connected to one end of the power supply or one end of the ground, and disposed in the liquid pool or the liquid adhesion portion at the other end;
    a voltage detection circuit for detecting a voltage between the one end of the one of the deterioration detection traces and the one end of the other of the deterioration detection traces; and
    a deterioration determination circuit for determining, based on the detected voltage, whether or not insulation deteriorates between the other end of the one of the deterioration detection traces and the other end of the other of the deterioration detection traces.

2. The printed circuit board according to claim 1, wherein the deterioration determination circuit determines the presence or absence of an insulation deterioration based on any one of a voltage value detected by the voltage detection circuit and a difference between the detected voltage value and a predetermined voltage value.

3. The printed circuit board according to claim 1, wherein
    the liquid pool is in the shape of a box having an opening in its top and a constant width in a horizontal direction to a liquid surface irrespective of the height of the liquid surface;
    a plurality of pairs of deterioration detection traces are provided; and
    ends of the plurality of pairs of deterioration detection traces are situated in different positions in a height direction of the liquid surface on a pair-by-pair basis.

4. The printed circuit board according to claim 1, wherein
    the liquid pool is in the shape of a box having an opening in its top and a varying width in a horizontal direction to a liquid surface in accordance with the height of the liquid surface;
    a plurality of pairs of deterioration detection traces are provided; and
    ends of the plurality of pairs of deterioration detection traces are situated in different positions in a height direction of the liquid surface on a pair-by-pair basis.

5. The printed circuit board according to claim 1, wherein the liquid pool has a groove for storing the liquid, formed on the printed circuit board.

6. The printed circuit board according to claim 5, wherein
    the printed circuit board is a multilayer printed circuit board;
    a plurality of pairs of deterioration detection traces are provided; and
    in the groove of the liquid pool, at least one of the plurality of pairs of deterioration detection traces is disposed in each of different layers of the multilayer printed circuit board.

7. The printed circuit board according to claim 1, wherein
    a plurality of deterioration detection traces each of which is connected to a power supply at one end and disposed in the liquid pool at the other end are connected to the voltage detection circuit through a switch; and
    the switch switches which deterioration detection trace to connect to the voltage detection circuit.

8. A motor drive comprising the printed circuit board according to claim 1.

9. A motor drive comprising the printed circuit board according to claim 1, wherein the printed circuit board is replaceable through a connector.

10. The printed circuit board according to claim 1, further comprising:
    a deterioration detection resistor mounted inside the liquid pool, wherein
    the ends of the pair of deterioration detection traces are connected to both ends of the deterioration detection resistor.

* * * * *